(12) United States Patent
Huang et al.

(10) Patent No.: US 9,854,688 B2
(45) Date of Patent: *Dec. 26, 2017

(54) DISPLAY APPARATUS

(71) Applicant: AU OPTRONICS CORP., Hsin-Chu (TW)

(72) Inventors: Wen-Hung Huang, Hsin-Chu (TW); Tung-Shin Lin, Hsin-Chu (TW); Cheng-Min Tsai, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/015,622

(22) Filed: Feb. 4, 2016

(65) Prior Publication Data

US 2016/0157365 A1 Jun. 2, 2016

Related U.S. Application Data

(62) Division of application No. 13/937,282, filed on Jul. 9, 2013, now Pat. No. 9,326,393.

(30) Foreign Application Priority Data

Oct. 17, 2012 (TW) .............................. 101138309 A

(51) Int. Cl.
*H05K 5/00* (2006.01)
*F21V 33/00* (2006.01)
(Continued)

(52) U.S. Cl.
CPC ....... *H05K 5/0017* (2013.01); *F21V 33/0052* (2013.01); *G02F 1/133308* (2013.01);
(Continued)

(58) Field of Classification Search
CPC ......... G02F 1/133308; G02F 1/133317; G02F 1/13454; G02F 1/1333; G02F 2201/00;
(Continued)

(56) References Cited

U.S. PATENT DOCUMENTS 4,204,231 A 5/1980 Permenter
8,044,942 B1 10/2011 Leonhard et al.
(Continued)

FOREIGN PATENT DOCUMENTS

| CN | 102610173 | 7/2012 |
| TW | 200841073 | 10/2008 |
| TW | 201219918 | 5/2012 |

*Primary Examiner* — Anthony Haughton
*Assistant Examiner* — Ingrid Wright
(74) *Attorney, Agent, or Firm* — WPAT, PC

(57) ABSTRACT

A display apparatus includes a frame, a panel module and an adjusting pad. The frame has a supporting surface, and the panel module includes a substrate and a plurality of chips. The substrate is disposed on the supporting surface and has a bonding region at a side of the substrate. The chips are disposed on the bonding region, wherein the chips and the supporting surface are located at two opposite surfaces of the substrate. The adjusting pad is disposed between the supporting surface and the bonding region, and the thickness of the adjusting pad is gradually reduced from a center portion of the adjusting pad toward two sides of the adjusting pad. Another display apparatus, in which a frame and an adjusting pad are integrated into one piece, is provided.

17 Claims, 5 Drawing Sheets

(51) Int. Cl.
*H05K 7/14* (2006.01)
*G02F 1/1333* (2006.01)
*G02F 1/1345* (2006.01)

(52) U.S. Cl.
CPC ........... *H05K 7/14* (2013.01); *G02F 1/13454* (2013.01); *G02F 2001/133317* (2013.01)

(58) Field of Classification Search
CPC .. G02F 2202/00; G06F 1/1637; G06F 1/1656; G06F 1/16; H05K 5/0017; H05K 1/181; H05K 2201/10128; H05K 7/14; H05K 13/00; H05K 5/0043; F21V 33/0052
USPC .......................... 361/679.21, 679.01, 679.02
See application file for complete search history.

(56) References Cited

U.S. PATENT DOCUMENTS

| | | |
|---|---|---|
| 2004/0213994 A1 | 10/2004 | Kozakai et al. |
| 2011/0228460 A1 | 9/2011 | Kim et al. |
| 2011/0292317 A1 | 12/2011 | Kim et al. |
| 2012/0113351 A1 | 5/2012 | Cheng et al. |
| 2012/0257412 A1* | 10/2012 | Yeom ....................... B05D 5/06 362/607 |
| 2013/0256671 A1 | 10/2013 | Chen et al. |

\* cited by examiner

DISPLAY APPARATUS

This application is a division of and claims priority to U.S. patent application Ser. No. 13/937,282, filed Jul. 9, 2013, the disclosure of which is incorporated in its entirely herein by reference thereto.

TECHNICAL FIELD

The invention relates to a display apparatus, in particularly to a flat panel display.

BACKGROUND

As the manufacturing technology of flat panel displays is more mature, traditional CRT displays have been replaced by the flat panel displays. Currently, typical flat panel displays include liquid crystal displays (LCDs), plasma displays (PDPs), electrophoretic displays and organic light emitting displays (OLEDs). Among these displays, the LCDs have the most popularity.

For satisfying needs of consumers, the LCDs with wide viewing angle and low color shifting have become the mainstream of market. The currently often used wide viewing angle technologies include in plane switching (IPS) and advanced hyper viewing angle (AHVA). However, during the manufacturing of the LCD devices, high heat and high pressure are needed to bond driver chips to the glass substrate of the LCD panel, in such a step, the glass substrate can easily be deformed to bend, which causes abnormal light leakage while the LCD device is in a normally black mode.

SUMMARY

An embodiment of the invention provides a display apparatus including a frame, a panel module and an adjusting pad. The frame has a supporting surface. The panel module includes a substrate and a plurality of chips. The substrate is disposed on the supporting surface and the substrate has a bonding region at a side thereof. The chips are disposed on the bonding region. The chips and the bonding region are located on the supporting surface. The chips and the supporting surface are respectively located at two opposite surfaces of the substrate. The adjusting pad is disposed between the supporting surface and the bonding region. The thickness of the adjusting pad is gradually reduced from the center toward the two sides thereof.

Another embodiment of the invention provides a display apparatus including a frame and a panel module. The frame has a supporting surface and a first adjusting pad protruding from the supporting surface. The panel module includes a substrate and a plurality of chips. The substrate is disposed on the supporting surface and the substrate has a bonding region at a side thereof. The first adjusting pad is located below the bonding region. The chips are disposed on the bonding region. The chips and the supporting surface are respectively located at two opposite surfaces of the substrate.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
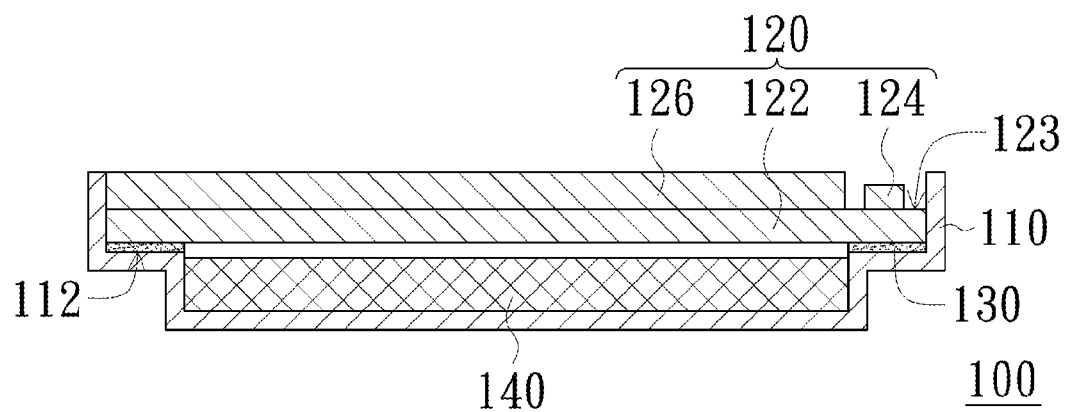
FIG. 1 is a schematic cross sectional view of a display apparatus according to an embodiment of the invention.
Figure 2:
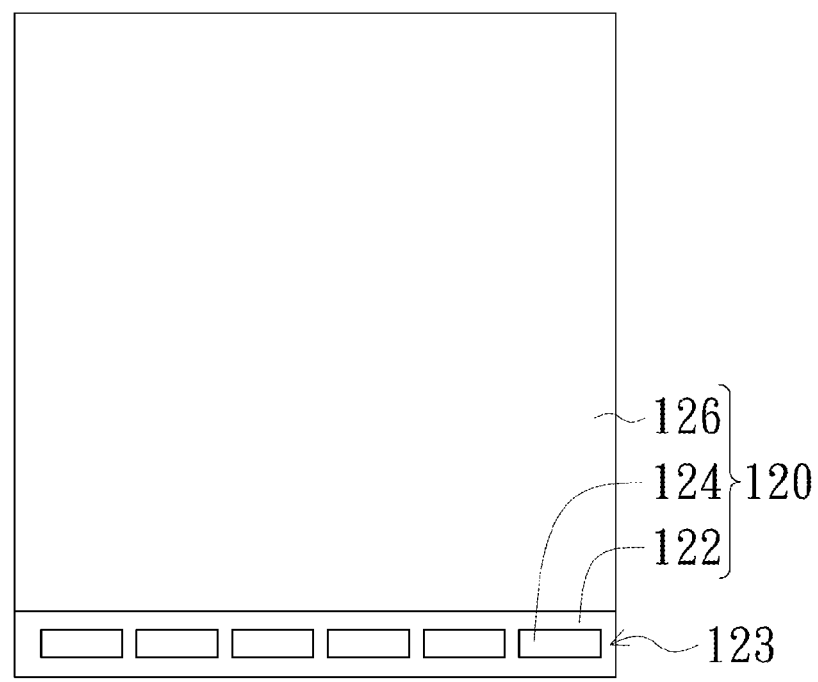
FIG. 2 is a schematic top view of a panel module in FIG. 1.

FIG. 1 is a schematic cross sectional view of a display apparatus according to an embodiment of the invention. FIG. 2 is a schematic top view of a panel module in FIG. 1. Referring to FIG. 1 and FIG. 2, the display apparatus 100 includes a frame 110 and a panel module 120. The frame 110 has a supporting surface 112, and the panel module 120 has a substrate 122 and a plurality of chips 124. The substrate 122 is disposed on the supporting surface 112, and the substrate 122 has a bonding region 123 at a side thereof. The chips 124 are disposed on the bonding region 123. The chips 124 and the bonding region 123 are disposed above the supporting surface 112. The chips 124 and supporting surface 112 are respectively located at above and below of the substrate 122. In this embodiment, the material of the substrate 122 is, for example, glass, but not limited thereto. The substrate 122, for example, includes an active device array (such like a thin film transistor array). The panel module 120 can further include another substrate 126 disposed on the substrate 122. The panel module 120 has the function of displaying images and can be a liquid crystal display module, an organic light emitting display module, an eletrophoretic display module and an electrowetting display module, but not limited thereto.

Since the substrate 122 is easily deformed flexure when the chips 124 is being bonded to the bonding region 123, the display apparatus 100 of this embodiment further includes an adjusting pad 130 disposed between the supporting surface 112 and the bonding region 123 for solving the problem of the flexure of the substrate 122. The adjusting pad 130 of this embodiment is detailed below.

Figure 3A:
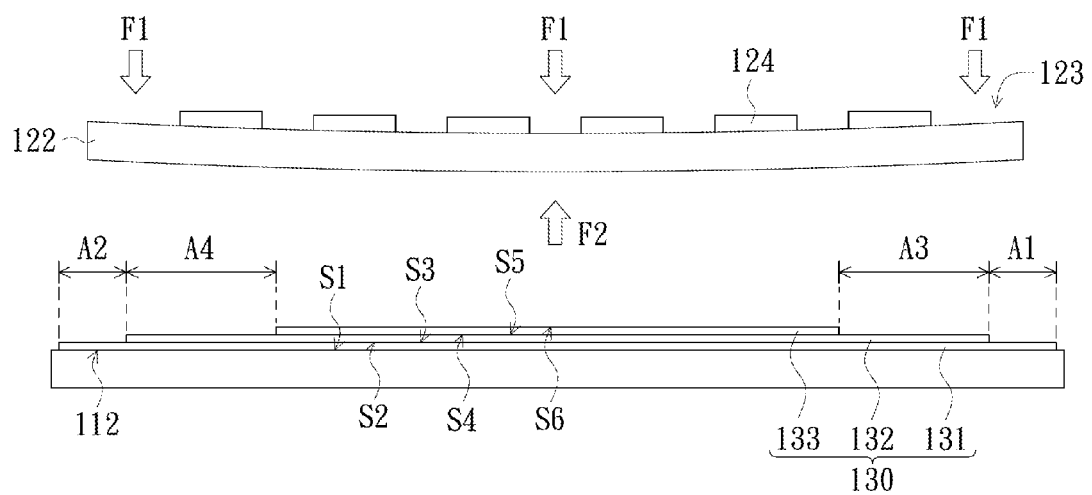
FIG. 3A and FIG. 3B are schematic views showing the panel module is disposed on the supporting surface of the frame.
Figure 3B:
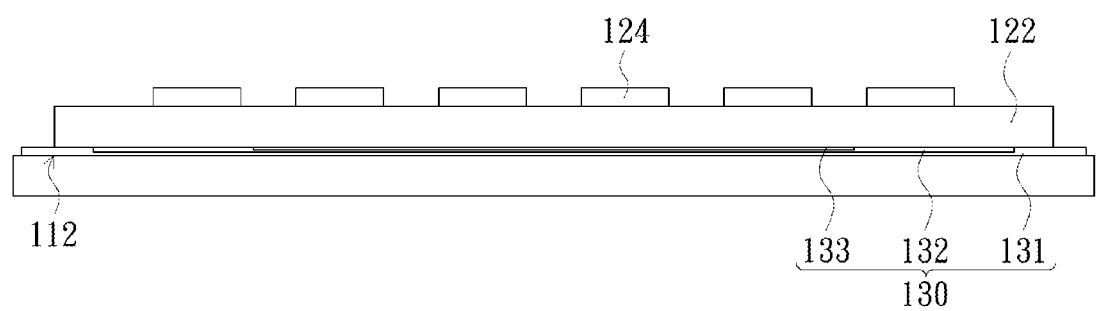

FIG. 3A and FIG. 3B are schematic views showing the panel module is disposed on the supporting surface of the frame. In the drawings, only the substrate 122 and the chips 124 are used to represent the panel module 120, and the supporting surface 112 is used to represent the frame 110. As FIG. 3A shows, the adjusting pad 130 of the embodiment is used for leveling the flexural substrate 122. Since after the chips 124 are bonded to the substrate 122, the substrate 122 is affected by stress and is deformed to a shape that the center portion is downwardly bended. Accordingly, the thickness of the adjusting pad 130 is gradually reduced from the center toward the two sides thereof. In other words, the thickness variation of the adjusting pad 130 can be adjusted according to the degree of the flexure of the substrate 122.

The manner of how to make the thickness of the adjusting pad gradually reduce from the center toward the two sides of the invention is not limited. In this embodiment, the adjusting pad 130 has a plurality of base materials (such as a first base material 131, a second base material 132 and a third base material 133) stacked with each other for forming the adjusting pad 130 with the thickness gradually reducing from the center toward the two sides. These base materials are such like adhesive tapes, but not limited thereto. These base materials of the adjusting pad 130 are, for example, stripe shaped and sequentially stacked, wherein the second base material 132 is disposed on the first base material 131, and the third base material 133 is disposed on the second base material 132. The thickness of each of the base material is determined according to the degree of the flexure of the substrate 122. Generally speaking, the thickness of the base material is, for example, 0.0025 mm to 0.05 mm, but not limited thereto. The base material can be compressible material such as foam, or can be incompressible material such as polyethylene terephthalate (PET).

Following the above mentioned, for any two of the adjacent base materials, the length of the under base material is longer than the length of the upper base material. In other words, the length of the first base material 131 is longer than the length of the second base material 132, and the length of the second base material 132 is longer than the length of the third base material 133. Besides, for any two adjacent substrates, two side of the under base material has regions which are not overlapped by the upper substrate. And the regions have the same dimensions. That is, the two regions A1, A2 of the first base material 131 which are not overlapped by the second base material 132 have the same dimensions. The two regions A3, A4 of the second base material 132 which are not overlapped by the third base material 133 have the same dimensions.

The first base material 131 has a first surface S1 and a second surface S2 opposite to each other. The second base material 132 has a third surface S3 and a fourth surface S4 opposite to each other. The third base material 133 has a fifth surface S5 and a sixth surface S6 opposite to each other. The first surface S1 is adhesive and is attached to the supporting surface 112. The second surface S2 is adhesive, and the third surface S3 is attached to the second surface S2. The fourth surface S4 and the sixth surface S6 are nonadhesive. The fifth surface S5 is adhesive and is attached to the fourth surface S4.

When a force F1 is exerted on the panel module to fix it on the supporting surface 112 of the frame 110, the thicker center part of the adjusting pad 130 will first contact with the substrate 122. During the time that the panel module 120 is continuously pressed, the thicker part of the adjusting pad 130 provides a reactive force F2 upwardly pushing the downwardly flexural part of the substrate 122, thus leveling the substrate 122. Therefore, as FIG. 3B shows, when the two sides of the substrate 122 are attached to the exposed second surface S2 of the first base material 133, the flatness of the substrate 122 is well improved. The downgrade of the display quality of the display apparatus 100 (as shown in FIG. 1) caused from the flexure of the substrate 122 can be prevented.

In this embodiment, at least one of the chips 124 has a projection which is completely projected onto the top substrate of the adjusting pad 130. In other words, the length of the third base material 133 is larger than or equal to the length of the single chip 124, and the width of the third base material 133 is larger than or equal to the width of the single chip 124. Besides, all the chips 124 are disposed over the second base material 132. In addition, the first base material 133 on the bottom can use light shielding material as a light shielding layer for preventing light leakage from the edge of the substrate 122.

It should be mentioned that although the adjusting pad 130 has three base materials in this embodiment, however, the number of the base materials is not limited thereto. The number of the base materials can be adjusted according to the degree of the flexure of the substrate 122. Besides, since the frame 110 of the invention is a component used for carrying the panel module 120, the specific structure of the frame is not limited.

Referring to FIG. 1, in an embodiment that the panel module 120 is a non-self emitting panel module (such as a liquid crystal panel module), the display apparatus 100 can further include a backlight module 140 disposed below the panel module 120 for providing the light needed by the panel module 120. The backlight module 140 can include light emitting devices, light guiding plates and optical films. In other embodiment that the panel module 120 is a self emitting panel module (such as an organic light emitting panel module), or a reflective panel module (such as an electrophoretic panel module or an electrowetting panel module), the backlight module 140 can be omitted. Besides, in addition to dispose the adjusting pad 130 between the supporting surface 112 and the bonding region 123, in case the flexure is occurred at the other side of the substrate 122, the adjusting pad 130 can be disposed between the flexural side portion of the substrate 122 and the supporting surface 112.

Figure 4:
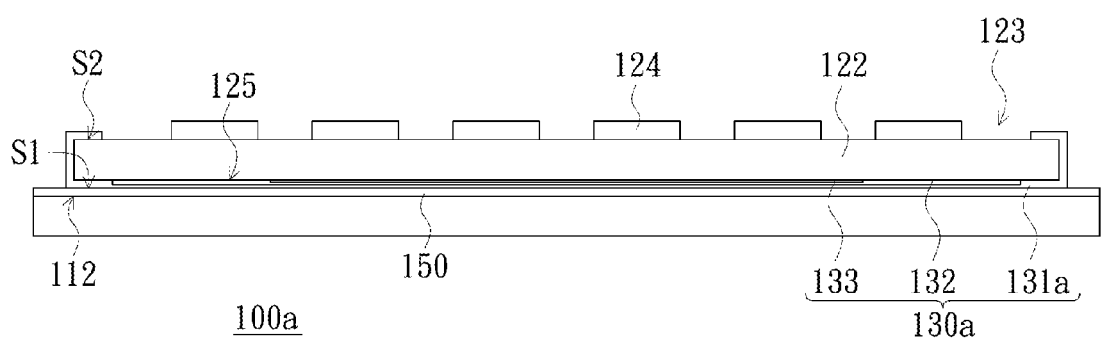
FIG. 4 is a schematic view of a display apparatus according to another embodiment of the invention.

FIG. 4 is a schematic view of a display apparatus according to another embodiment of the invention. Referring to FIG. 4, which is similar to FIG. 3B, only the substrate 122 and the chips 124 are used to represent the panel module, and the supporting surface 112 is used to represent the frame. The structure and advantages of display apparatus 100a of this embodiment is similar to that of the display apparatus 100 of the above mentioned embodiment. The difference is that the first surface S1 of the first base material 133a of the adjusting pad 130a is nonadhesive. A double sided tape 150 is disposed between the first surface S1 of the adjusting pad 130a and the supporting surface 112 for attaching the first surface S1 to the supporting surface 112. Besides, two ends of the first base material 133a are, for example, further bended to the bonding region 123, and the second surface S2 of the first base material 133a is, for example, adhered to the bonding region 123 and the back surface 125 of the substrate 122.

Figure 5:
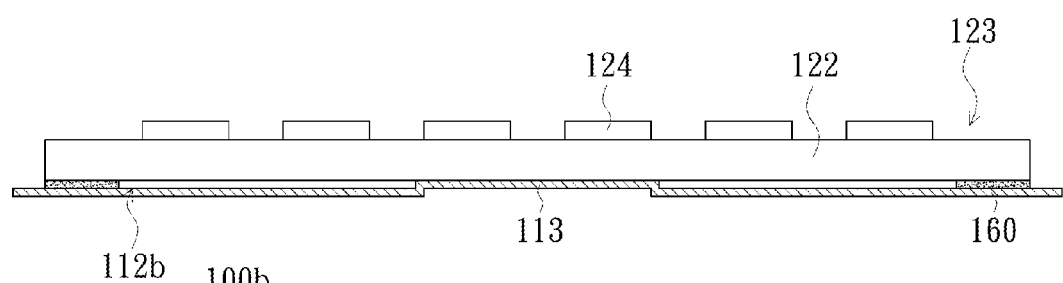
FIG. 5 is a schematic view of a display apparatus according to another embodiment of the invention.

FIG. 5 is a schematic view of a display apparatus according to another embodiment of the invention. Referring to FIG. 5, which is similar to FIG. 3B, only the substrate 122 and the chips 124 are used to represent the panel module, and the supporting surface 112b is used to represent the frame. The structure and advantages of display apparatus 100b of this embodiment is similar to that of the display apparatus 100 of the above mentioned embodiment. The difference is that the frame of the embodiment has a first adjusting pad 113 protruding from the supporting surface 112b. The first adjusting pad 113 is located between the supporting surface 112b and the bonding region 123. The frame is, for example, a metal frame. The first adjusting pad 113 can be formed by punching the frame. The function of the first adjusting pad 113 is similar to the function of the above mentioned adjusting pad 130 and is not repeated herein. Besides, the display apparatus 100b can further include an adhering portion 160 attached between the supporting surface 112b and the substrate 122. The adhering portion 160 is located at two sides of the first adjusting pad 113. The adhering portion 160 is, for example, a double sided tape for fixing the substrate 122 to the supporting surface 112b. Besides, the display apparatus 100b can include the above mentioned backlight module according to the type of the panel module.

Figure 6:
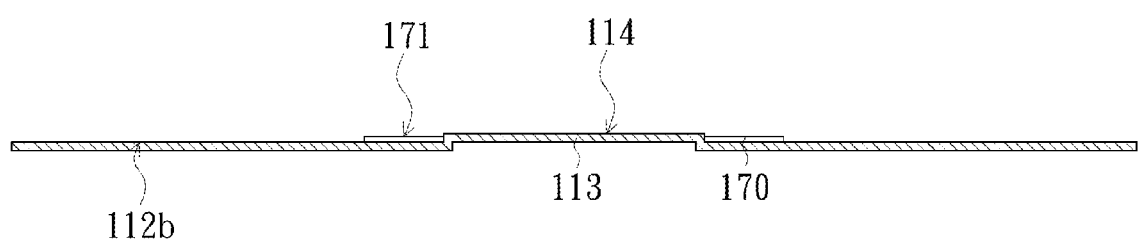
FIG. 6 is a schematic view showing a frame and a second adjusting frame of a display apparatus according to another embodiment of the invention.

In another embodiment, as FIG. 6 shows, in addition to directly form the first adjusting pad 113 on the frame, a second adjusting pad 170 can further be attached to the supporting surface 112b. The second adjusting pad 170 is located at two sides of the first adjusting pad 113 and bears against the first adjusting pad 113. A top surface 171 of the second adjusting pad 170 facing the substrate is lower than a top surface 114 of the first adjusting pad 113 facing the substrate. In other words, the thickness or height of the second adjusting pad 170 is smaller than the thickness or height of the first adjusting pad 113. Considering the degree of the flexure of the substrate, a third adjusting pad (not shown) having thickness thinner than the second adjusting pad 170 can be disposed adjacent to two sides of the second adjusting pad 170. Moreover, a fourth adjusting pad (not shown) having thickness thinner than the third adjusting pad can be disposed adjacent to two sides of the third adjusting pad. Alternatively, a plurality of base material s can be stacked as the above mentioned embodiment to form the second adjusting pad with different thickness.

In conclusion, in the display apparatus of the invention, the adjusting pad can be used to bear against the flexural portion of the substrate and level the substrate, such that the downgrade of the display quality of the display apparatus caused from the flexure of the substrate can be prevented.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A display apparatus comprising:
    a frame having a supporting surface;
    a panel module comprising:
        a substrate disposed on the supporting surface and the substrate having a bonding region at a side thereof; and
        a plurality of chips disposed on the bonding region, wherein the chips and the bonding region are located on the supporting surface, and the chips and the supporting surface are respectively located at two opposite surfaces of the substrate; and
    an adjusting pad disposed between the supporting surface and the bonding region of the substrate, and the thickness of the adjusting pad being gradually reduced from the center toward the two sides thereof, wherein the thickness of the adjusting pad corresponding to the chips disposed at the center of the bonding region is greater than the thickness of the adjusting pad corresponding to the chips disposed at the two sides of the bonding region.

2. The display apparatus as claim 1, wherein the adjusting pad comprises a plurality of base materials, the base materials are stripe shaped and sequentially stacked, and a length of an under base material is longer than a length of an upper base material for any two adjacent base materials.

3. The display apparatus as claim 2, wherein the under base material has two side regions being not overlapped by the upper base material for any two adjacent base materials.

4. The display apparatus as claim 2, wherein at least one of the chips has a projection being completely projected onto the top base material of the adjusting pad.

5. The display apparatus as claim 2, wherein the base materials at least has a first layer, a second layer and a third layer, the second layer is disposed on the first layer, and the third layer is disposed on the second layer, the first layer has a first surface and a second surface opposite to each other, the second layer has a third surface and a fourth surface opposite to each other, the third layer has a fifth surface and a sixth surface opposite to each other, the first surface faces the supporting surface, the second surface is adhesive, and the third surface is attached to the second surface, the fourth surface and the sixth surface are nonadhesive, the fifth surface is adhesive and is attached to the fourth surface.

6. The display apparatus as claim 5, wherein the first surface is adhesive and is attached to the supporting surface.

7. The display apparatus as claim 5, further comprising a double sided tape disposed between the first surface and the supporting surface, wherein the first surface is nonadhesive, and the first surface is attached to the supporting surface with the double sided tape.

8. The display apparatus as claim 7, wherein two ends of the first base material are further bent to the bonding region and the second surface is attached to the bonding region.

9. The display apparatus as claim 5, wherein the chips are completely disposed over the second base material.

10. The display apparatus as claim 5, wherein a back surface of the substrate is attached to a part of the second surface.

11. The display apparatus as claim 2, wherein the bottom base material is a light shielding layer.

12. The display apparatus as claim 2, wherein the base materials are adhesive tapes.

13. The display apparatus as claim 1, further comprising a backlight module disposed below the panel module.

14. A display apparatus comprising:
    a frame having a supporting surface and a first adjusting pad protruding from the supporting surface; and
    a panel module comprising:
        a substrate disposed on the supporting surface and the substrate having a bonding region at a side thereof, and the first adjusting pad disposed between the supporting surface and the bonding region of the substrate; and
        a plurality of chips disposed on the bonding region, wherein a projection of the bonding region is located on the supporting surface, and the chips and the supporting surface are respectively located at two opposite surfaces of the substrate; and
        a second adjusting pad attached on the supporting surface and located at two sides of the first adjusting pad, wherein the height of the first adjusting pad is greater than the height of the second adjusting pad.

15. The display apparatus as claim 14, wherein the frame is a metal frame and the first adjusting pad is formed by punching the frame.

16. The display apparatus as claim 14, further comprising an adhering portion attached between the supporting surface and the substrate, and the adhering portion is located at two sides of the first adjusting pad.

17. The display apparatus as claim 14, further comprising a backlight module disposed below the panel module.

* * * * *